United States Patent
Bains et al.

(10) Patent No.: US 12,347,507 B2
(45) Date of Patent: Jul. 1, 2025

(54) METHOD AND APPARATUS FOR MEMORY CHIP ROW HAMMER THREAT BACKPRESSURE SIGNAL AND HOST SIDE RESPONSE

(71) Applicant: Intel Corporation, Santa Clara, CA (US)

(72) Inventors: Kuljit S. Bains, Olympia, WA (US);
Bill Nale, Livermore, CA (US);
Jongwon Lee, Hillsboro, OR (US);
Sreenivas Mandava, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 869 days.

(21) Appl. No.: 17/315,303

(22) Filed: May 8, 2021

(65) Prior Publication Data

US 2021/0264999 A1     Aug. 26, 2021

Related U.S. Application Data

(60) Provisional application No. 63/183,509, filed on May 3, 2021.

(51) Int. Cl.
*G11C 29/02* (2006.01)
*G11C 29/00* (2006.01)
*G11C 29/42* (2006.01)
*G11C 29/44* (2006.01)

(52) U.S. Cl.
CPC ............ *G11C 29/025* (2013.01); *G11C 29/42* (2013.01); *G11C 29/44* (2013.01); *G11C 29/783* (2013.01)

(58) Field of Classification Search
CPC ....... G11C 29/025; G11C 29/42; G11C 29/44; G11C 29/783; G11C 2029/1202; G11C 7/24; G11C 11/406; G11C 11/40611; G11C 7/1045; G11C 11/4096; G06F 3/0658; G06F 3/0659; G06F 11/1048
See application file for complete search history.

(56) References Cited

U.S. PATENT DOCUMENTS

| | | | |
|---|---|---|---|
| 10,141,034 B1 | 11/2018 | Zitlaw | |
| 11,011,215 B1* | 5/2021 | Parry | ............... G06F 13/1668 |
| 11,631,448 B1* | 4/2023 | Lee | ............... G11C 11/40611 |
| | | | 711/106 |
| 2014/0006703 A1 | 1/2014 | Bains et al. | |
| 2014/0059287 A1 | 2/2014 | Bains et al. | |
| 2014/0355332 A1 | 12/2014 | Youn et al. | |
| 2015/0109871 A1 | 4/2015 | Bains et al. | |

(Continued)

OTHER PUBLICATIONS

Hastings, et al:, A New Doctrine For Hardware Security, arXiv:2007.09537v1, Jul. 18, 2020. 10 pages.

(Continued)

*Primary Examiner* — Jerome Leboeuf
(74) *Attorney, Agent, or Firm* — Compass IP Law PC

(57) ABSTRACT

A memory chip includes row hammer threat detection circuitry. The memory chip includes an output. The memory chip includes backpressure signal generation circuitry coupled between the row hammer detection circuitry and the output. The backpressure signal generation circuitry is to generate a backpressure signal to be sent from the output in response to detection by the row hammer threat detection circuitry of a row hammer threat.

21 Claims, 8 Drawing Sheets

(56) References Cited

U.S. PATENT DOCUMENTS

| | | |
|---|---|---|
| 2016/0005457 A1 | 1/2016 | Bains |
| 2016/0225434 A1 | 8/2016 | Halbert et al. |
| 2016/0254044 A1 | 9/2016 | Bains et al. |
| 2016/0276015 A1 | 9/2016 | Bains et al. |
| 2017/0076779 A1 | 3/2017 | Bains et al. |
| 2017/0076780 A1 | 3/2017 | Bains |
| 2017/0092350 A1 | 3/2017 | Halbert et al. |
| 2017/0236575 A1 | 8/2017 | Querbach et al. |
| 2017/0365324 A1 | 12/2017 | Bains et al. |
| 2018/0025771 A1 | 1/2018 | Bains |
| 2018/0158507 A1* | 6/2018 | Bang ................ G11C 11/40611 |
| 2018/0174639 A1 | 6/2018 | Bains et al. |
| 2019/0066759 A1 | 2/2019 | Nale |
| 2019/0066808 A1 | 2/2019 | Nale |
| 2019/0073161 A1 | 3/2019 | Nale |
| 2019/0108870 A1 | 4/2019 | Bains |
| 2019/0228813 A1 | 7/2019 | Nale et al. |
| 2020/0117393 A1 | 4/2020 | Boehm et al. |
| 2021/0020262 A1* | 1/2021 | Penney ............... G11C 11/4085 |
| 2022/0130484 A1* | 4/2022 | Prather .............. G11C 11/4085 |
| 2022/0246201 A1* | 8/2022 | Kim .................... G11C 7/1063 |

OTHER PUBLICATIONS

JEDEC Standard, DDR5 SDRAM, JEDEC Solid State Technology Association, JEDEC Standard No. 79-5, Jul. 2020, 5 pages. number(s), publisher, city and/or country where published.

Extended European Search Report for Patent Application No. 23167111.6, Mailed Oct. 4, 2023, 12 pages.

\* cited by examiner

METHOD AND APPARATUS FOR MEMORY CHIP ROW HAMMER THREAT BACKPRESSURE SIGNAL AND HOST SIDE RESPONSE

RELATED CASES

This application claims the benefit of U.S. Provisional Application No. 63/183,509, entitled, "Method and Apparatus For Row Hammer Recovery", filed May 3, 2021, which is incorporated by reference in its entirety.

FIELD OF THE INVENTION

The field of invention pertains to the computing sciences generally, and, more specifically, to a method and apparatus for a memory chip row hammer threat backpressure signal and host side response.

BACKGROUND

A Dynamic Random Access Memory (DRAM) cell stores charge in a capacitive cell. During a standby mode (when there is no access to the cell), charge can continually leak from a cell to the point where its stored value is changed (e.g., from a 1 to a 0).

In order to prevent such data loss, a DRAM memory chip is designed to refresh its storage cells. The refresh activity typically entails reading from a cell to detect its stored value and then writing the same value back into the cell. The write operation replenishes the cell with a fresh amount of charge for the particular stored value.

In order to guarantee the integrity of its data over an extended run time, a memory chip will periodically refresh its storage cells. Specifically, each cell in the memory chip's cell array will be refreshed with sufficient frequency to prevent the loss of its stored data even if the cell is infrequently accessed.

A recently published Joint Electron Device Engineering Council (JEDEC) standard, dual data rate 5 ("DDR5"), defines cooperative refreshing behavior between a memory chip and the host (memory controller). Specifically, a memory chip manufacturer defines (in mode register (MR) space of a memory chip) certain timing requirements related to the refreshing of the cells in the memory chip's cell array.

The memory controller reads the timing requirements and schedules REFRESH commands according to a schedule that is consistent with the timing requirements. The memory controller then issues REFRESH commands to the memory chip consistent with the schedule. In response to each REFRESH command, the memory chip refreshes cells at a granularity specified by the type of REFRESH command it receives (all banks in a particular bank group, or the same bank in all bank groups).

DRAM memory cells can also suffer from a data corruption mechanism referred to as "row hammer". In the case of row hammer, data can be corrupted in cells that are coupled to rows that are near (e.g., next to) a row that is frequently activated. As such, memory systems ideally include counters that monitor row activations. If a row is deemed to have received a number of activations over a time window that exceed a threshold, the cells that are coupled to the nearby rows are pro-actively refreshed to protect them against the row hammer effect.

The JEDEC DDR5 standard includes a row hammer mitigation approach referred to as "refresh management". In the case of refresh management, the memory controller counts row activations per bank. If the count for a bank exceeds a threshold specified by the memory chip manufacturer, the memory controller issues refresh management (RFM) commands to the memory chip.

In response to each RFM command, the memory chip refreshes cells at a granularity specified by the type of RFM command it receives (all banks in a particular bank group, or same bank in all bank groups). Notably, refreshes performed in response to RFM commands are additional refreshes beyond the normal scheduled refreshes that are implemented with REFRESH commands as described above.

The DDR5 standard also provides a mechanism for a memory chip to communicate the existence of a problem back to the memory controller. A typical DDR5 implementation, as depicted in FIG. 1, includes a pair of sub-channels 101_1, 101_2 coupled between a memory controller 102 and a memory module 103. For simplicity, the constituent memory module components for only one of the sub-channels is depicted. As observed in FIG. 1, the constituent components for a sub-channel include first and second ranks of memory chips 104_1, 104_2 that send/receive data to/from the memory controller 102 and a register clock driver (RCD) chip 105 that receives command and address (C/A) signals from the memory controller.

Each memory chip 106 includes an Alert_n output 107 that is used to signal a write cyclic redundancy check (CRC) error has occurred ("DQ CRC" write error). Here, DDR5 data transfers are performed in bursts that consume multiple cycles. Actual data is transferred during the earlier cycles and CRC information is transferred during the later cycles. Per write burst, each memory chip in the targeted rank internally calculates its own CRC information from the data it receives and compares it to the received CRC information. If there is a mismatch the memory chip asserts a flag on its Alert_n output 107 (for ease of drawing, FIG. 1 only labels one memory chip 106 and one Alert_n output 107).

The Alert_n output from each of the memory chips within a same rank are tied together and routed to the RCD chip 105. If any memory chip detects that a DQ CRC write error has occurred, according to the DDR5 standard, within 3 to 13 ns of the event, the memory chip will generate a pulse having a width within a range of 12 to 20 clock cycles (nCK). The RCD chip 105 receives the pulse and re-drives it on the sub-channel's ALERT_N wire 108 to inform the memory controller of the event.

Additionally, the RCD chip 105 is designed to detect parity errors with respect to the sub-channel's received C/A signals. If the RCD chip 105 detects a parity error within the C/A signals, the RCD chip 105 generates a pulse on the sub-channel's ALERT_N wire 108 having a width of 60-120 ns to inform the memory controller of the event.

FIG. 2 depicts the time windows for both the DQ CRC write error and CA parity error pulses. As observed in FIG. 2, both pulses are logic low assertions in that they both start with a falling edge and end with a rising edge. Notably, the minimum pulse width of the CA parity error is longer than the maximum pulse width of the DQ CRC write error so that the memory controller can distinguish which type of error has occurred.

FIGURES

A better understanding of the present invention can be obtained from the following detailed description in conjunction with the following drawings, in which.

DETAILED DESCRIPTION

Future generation memory chips are expected to be designed to include their own row hammer threat detection circuitry. For example, at least some future generation memory chips are expected to include additional DRAM cells per row that are used to hold that row's activation count. If the row activation count for any particular row reaches a threshold, the memory chip recognizes the existence of a "nominal" row hammer threat.

An extended row hammer threat can arise if the respective activation counts for a number of different rows in a same memory chip each reach their respective thresholds at approximately the same time ("row hammer overload"). In this case, the memory chip is expected to consume considerable time refreshing the collection of rows that are threatened (one set of nearby rows per row whose threshold has been reached).

Regardless as to which type of row hammer threat is detected by the memory chip (a "nominal" row hammer threat or "row hammer overload" threat, collectively referred to hereafter as a "row hammer (RH) threat", "row hammer (RH) event" or the like), the memory chip should inform the memory controller that it has detected a row hammer threat.

Additionally, particularly in cases where the row hammer threat is not expected to be mitigated until large numbers of refreshes are performed (e.g., row hammer overload), the memory chip should send some kind of row hammer related back pressure signal to the memory controller that informs the memory controller that it is temporarily inadvisable to send any further read, write or activate commands to the memory chip.

Figure 1:
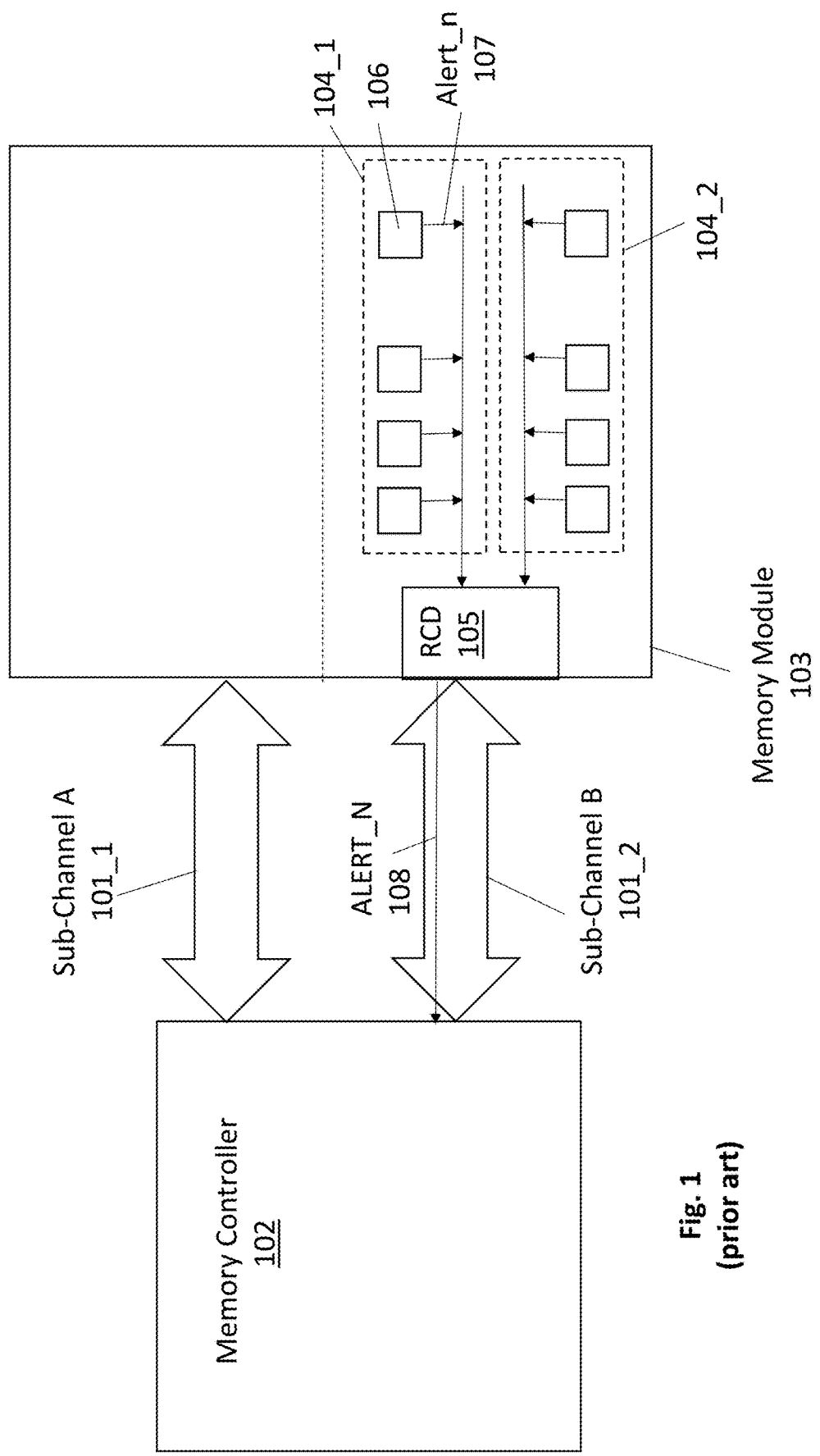
FIG. 1 (prior art) depicts a memory controller coupled to a memory module.
Figure 2:
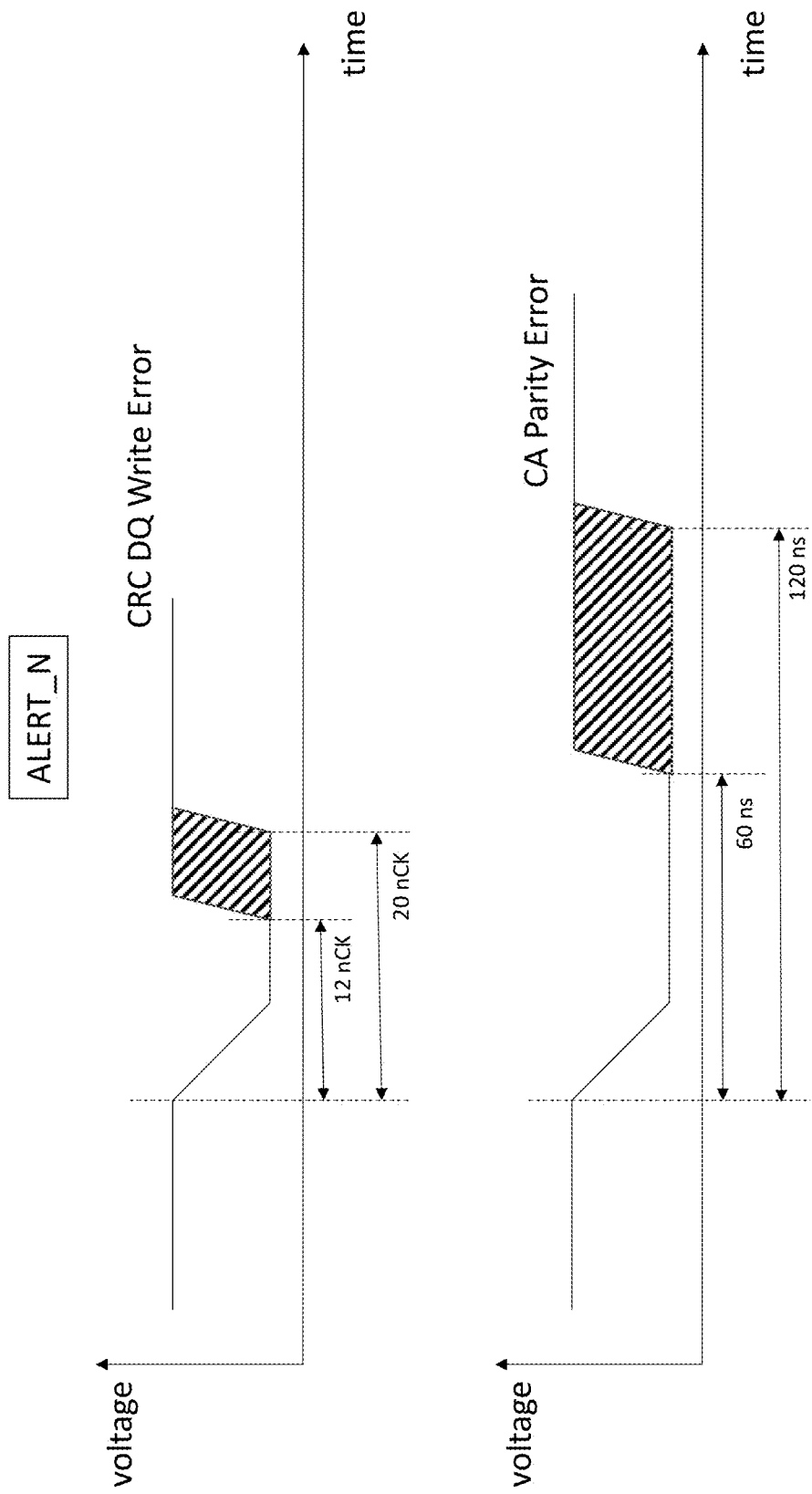
FIG. 2 (prior art) depicts CRC write error and C/A parity error signals.
Figure 3:
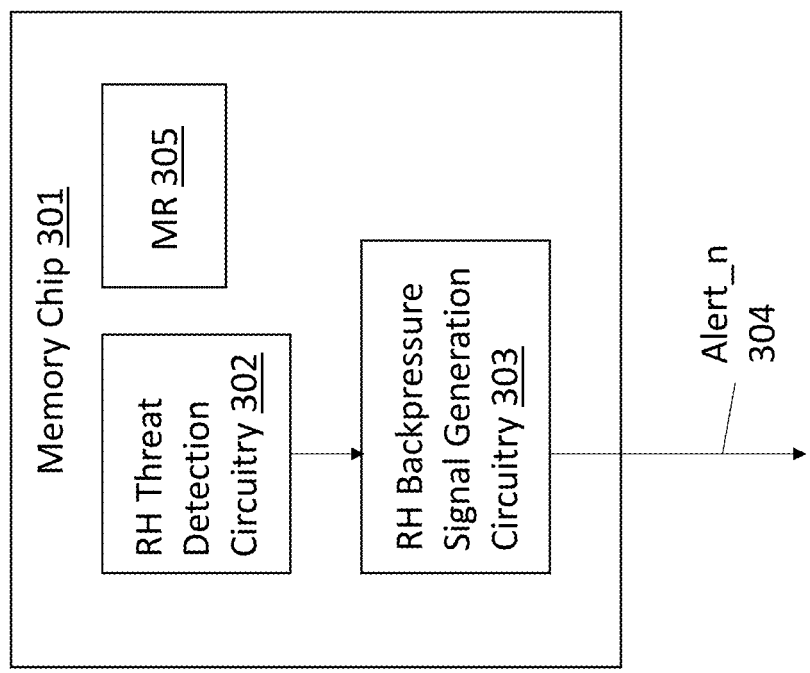
FIG. 3 shows an improved memory chip.

An improved memory chip 301 is therefore depicted in FIG. 3 that includes first circuitry 302 to internally detect an RH threat and second circuitry 302 to construct and send an RH back pressure signal from its Alert_n output 304 in response to its internal detection of an RH threat. According to various memory module implementations, consistent with the discussion of FIG. 1 above, the RH back pressure signal is received by an RCD chip and re-driven onto the ALERT_N wire of a sub-channel.

In various embodiments, the structure of the RH back pressure signal is different than both the DQ CRC write error and the C/A parity error so that it can be differentiated from these signals by the memory controller.

Figure 4:
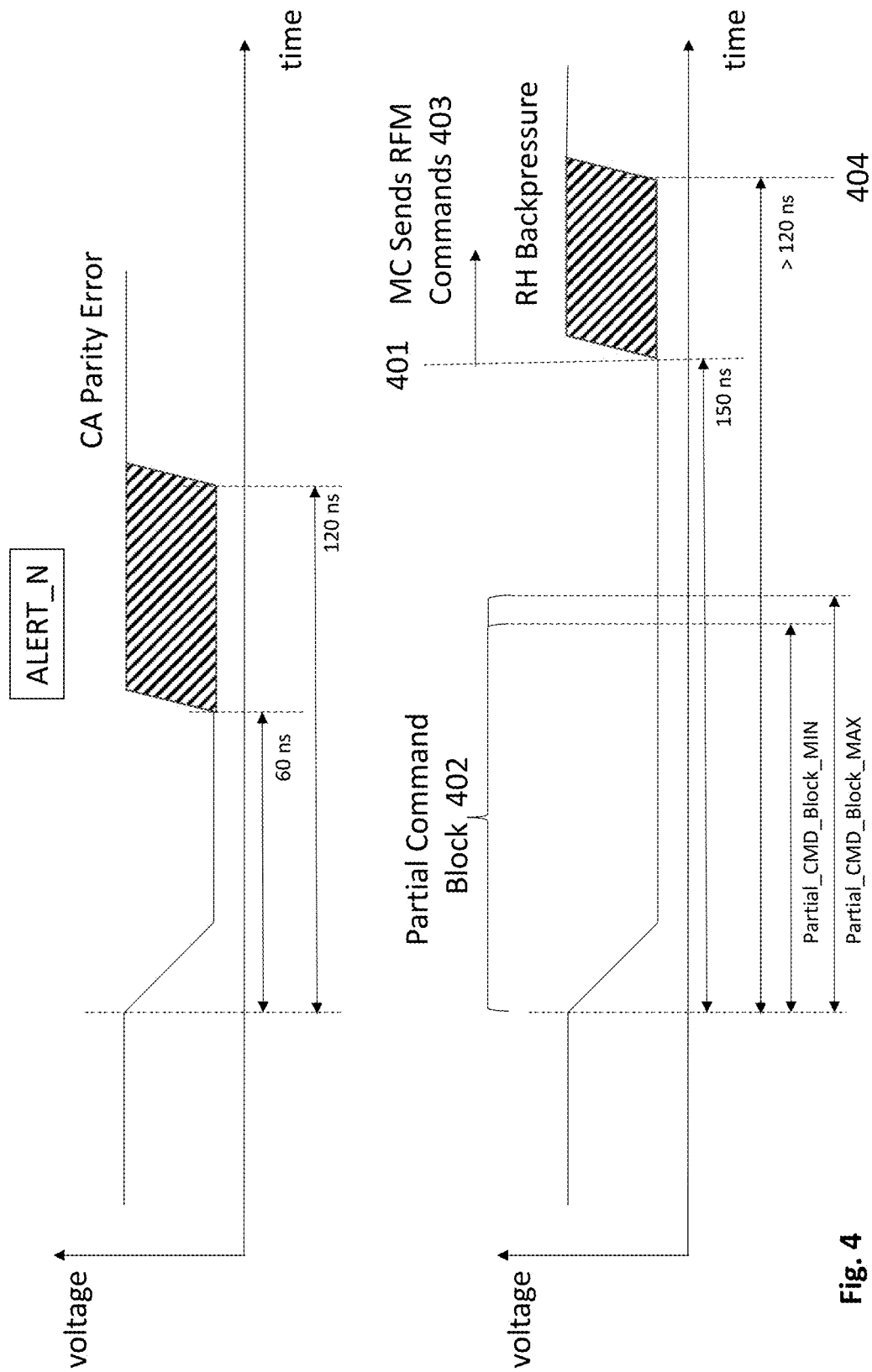
FIG. 4 shows a backpressure signal.

Specifically, as observed in FIG. 4, the minimum pulse width for the RH back pressure signal is greater than the maximum pulse width for the CA parity error signal. Here, once a pulse is asserted on the ALERT_N wire with a high to low transition, if the subsequent low to high transition that marks the end of the pulse occurs within the following 60 ns, the memory controller understands that a DQ CRC write error signal is being sent. By contrast, if the subsequent low to high transition occurs after 60 ns but within 120 ns the memory controller understands that a CA parity error signal is being sent. Finally, if instead the subsequent low to high transition 401 occurs after 120 ns the memory controller understands that an RH backpressure signal is being sent.

In various embodiments, as depicted in FIG. 4, the minimum pulse width of the backpressure signal is defined to be 150 ns so that there exists a 30 ns pulse width difference between the CA parity error signal and the backpressure signal. So doing allows for easy differentiation by the memory controller as to whether a CA parity error signal is being sent or if an RH backpressure signal is being sent (if the low to high transition occurs after 60 ns but within 120 ns the memory controller understands that a CA parity error signal is being sent, or, if the low to high transition 401 occurs at or after 150 ns the memory controller understands that a backpressure signal is being sent).

In various embodiments, the minimum and/or maximum pulse width definitions for the backpressure signal is/are defined in the memory chip's MR space 305 (e.g., along with pulse width definitions for the DQ CRC write and/or CA parity bit errors).

In further embodiments, the MR space 305 also includes a "partial command block" parameter (Partial_CMD_Block) that defines a time window 402 within which the memory controller is to cease the sending of at least those commands that can aggravate a row hammer threat (read, write, activate). Here, the partial command block time window 402 starts at the leading/falling edge of the ALERT_N pulse and terminates within a time range that is specified in the memory chip's MR space. Within time window 402, the memory controller stops sending at least certain kinds of commands such as read, write and activate commands.

In various embodiments, both minimum and maximum times are specified in MR space 305 for the partial command block window 402. The memory controller is expected to stop sending at least certain commands from the moment the memory controller first samples the leading/falling edge of the ALERT_N pulse until a period of time has elapsed 402 that falls within the partial block window's minimum and maximum settings.

Note that designing the memory controller to cease the sending of commands as soon it observes the leading/falling edge of the ALERT_N pulse does not distinguish between the other ALERT_N signals (DQ CRC write error and CA parity error). As such, the partial block time window will also cause cessation of commands if the ALERT_N signal is a DQ CRC write error or a CA parity error. The time window 402 can therefore be advantageously used, for instance, to correct the DQ CRC write error or CA parity error. The memory chip is expected to execute all commands that it receives from the memory controller before the memory controller ceases its sending of commands in response to its sampling of the ALERT_N falling edge.

In various configurations, the settings for the partial command block window 402 are such that within the window 402, or shortly after the window 402 expires, the memory controller is able to determine whether the ALERT_N signal is a DQ CRC write error or a CA parity error. For instance, the partial block window 402 is configured to extend beyond the minimum pulse width for a CA parity error (60 ns from the high to low transition).

By so doing, while the memory controller is blocking the issuing of certain commands within the window 402, the memory controller might actually observe a low to high transition that corresponds to a DQ CRC write error or a CA parity error. If so, the memory controller is free to send any commands it desires to after the window 402 expires (the block is lifted).

By contrast, if the pulse width of the ALERT_N signal extends beyond the window 402 and reaches the minimum pulse width 401 for am RH backpressure signal, the memory controller recognizes that a RH backpressure signal is at play and begins to send RFM commands 403 to the memory chip. The sending of the RFM commands 403 gives the memory chip the authority to apply refreshes to mitigate its row hammer threat.

In various embodiments, the memory controller stops sending RFM commands 403 once the memory chip terminates the pulse (low to high transition is observed), or, if the pulse width reaches the maximum pulse 404 for the RH backpressure signal as specified in the memory chip's MR space (whichever comes first). Here, in various embodiments, the memory chip's backpressure signal circuitry 303 is designed to terminate the Alert_N pulse by way of a rising edge (which the RCD chip re-drives) in response to a signal from the memory chip's row hammer threat detection circuitry 302 that the row hammer threat that prompted the backpressure signal has been mitigated with sufficient refreshes.

If instead the memory controller stops sending RFM commands because the maximum specified pulse width 404 has been reached, ideally, the memory chip does not need any more time to mitigate the row hammer threat. As such, in various embodiments, the difference between the minimum and maximum pulse width settings 401, 404 is defined in view of the worst case row hammer threat (e.g., row hammer overload) that is expected to be successfully mitigated.

Refreshes performed in response to the RFM commands 403 sent by the memory controller in response to the backpressure signal are deemed to be additional refreshes sent beyond the nominal refreshing activity accomplished with REFRESH commands and any refreshing activity accomplished with RFM commands that are triggered from the memory controller's tracking of bank activations (both types of refreshing activities continue in addition to the refreshes performed in response to the row hammer overload signal).

In various embodiments, once the memory chip detects a row hammer threat event, the memory chip updates its MR space 305 to confirm the type of error (e.g., row hammer overload) and/or additional information concerning the error (e.g., which specific rows have reached their respective threshold). The memory controller is then free to read the MR space 305 to confirm and/or better understand the situation at the memory chip 301.

For example, if the MR space 305 indicates which rows are reaching their threshold, the memory controller RFM commands 403 that are send in response to the backpressure signal can be targeted RFM commands that specify a bank address where the rows' corresponding victim rows reside. In an alternative or combined approach, the MR space 305 indicates the number of RFM commands needed to mitigate the row hammer overload condition. In this case, the memory controller can cease sending RFM commands 403 in response to the backpressure signal after the specified number of RFM commands have been sent (rather than waiting for the pulse to terminate or the maximum pulse width 404 to be reached). In yet another or combined embodiment, the MR space 305 indicates how much time the memory chip needs to spend refreshing before the RH threat is mitigated. In this case, the memory controller will send RFM commands 403 in response to the backpressure signal for the specified amount of time and then cease the sending of the RFM commands 403.

Additionally, in the case of multi-rank memory modules, without reading MR register space, the memory controller may not know which of the ranks are suffering the row hammer threat (because the Alert_n pin of the memory chips from more than one rank are tied to the same RCD input). In this case, the memory controller can be designed to apply row hammer mitigation (cease the sending of read/write/activate commands within window 402 and begin the sending of RFM commands 403) to all of the ranks. If the memory controller reads MR register space, it can understand which rank's memory chips are suffering a row hammer threat and apply row hammer mitigation only to memory chips of the afflicted rank.

Once the memory chip observes that the row hammer threat is mitigated, in various embodiments, the memory chip clears any of MR space 305 that was set to indicate the existence of the threat. Alternatively, the memory controller can clear the MR space (via a write to the memory chip's MR space 305) once the memory chip terminates the pulse or the memory controller has sent all permitted RFM commands 403 in response to the assertion of the backpressure signal.

According to the embodiments described above, the memory chip was presumed to issue refreshes (when not in self refresh mode) only in response to REFRESH and RFM commands sent by the memory controller. In alternative or combined implementations, the memory chip 301 includes circuitry to schedule/issue refreshes that it initiates on its own. In such embodiments, the number of RFM commands 403 that are needed by the memory chip may be reduced (e.g., to zero) because the memory chip can initiate enough refreshes internally to mitigate the problem so long as the memory controller ceases sending new read, write or activate commands (e.g., the memory can mitigate the threat internally within window 402).

According to yet another approach, the memory controller automatically places the memory chip in self refresh mode in response to the memory chip asserting the backpressure signal (instead of sending RFM commands 403).

According to yet another approach, a read burst includes a meta data bit that is used to indicate whether a row hammer threat exists. For example, one bit is reserved for each memory chip per read transaction (e.g., 0=row hammer threat does not exist; 1=row hammer threat exists). If any meta data bit indicates that a row hammer threat exists, the memory controller issues a series of RFM commands spaced by a read command at the same address. The memory controller continues to operate in this state until the meta data indicates a row hammer threat does not exist.

Although embodiments described above have emphasized a single ALERT_N wire per sub-channel and all memory chips of a same rank or same sub-channel being tied to the same alert wire on the memory module, it is pertinent to recognize that other embodiments that depart from these specific designs can nevertheless incorporate the teachings provided herein. For example, there may be multiple ALERT_N wires per sub-channel (e.g., one such wire per rank, etc.).

Figure 5:
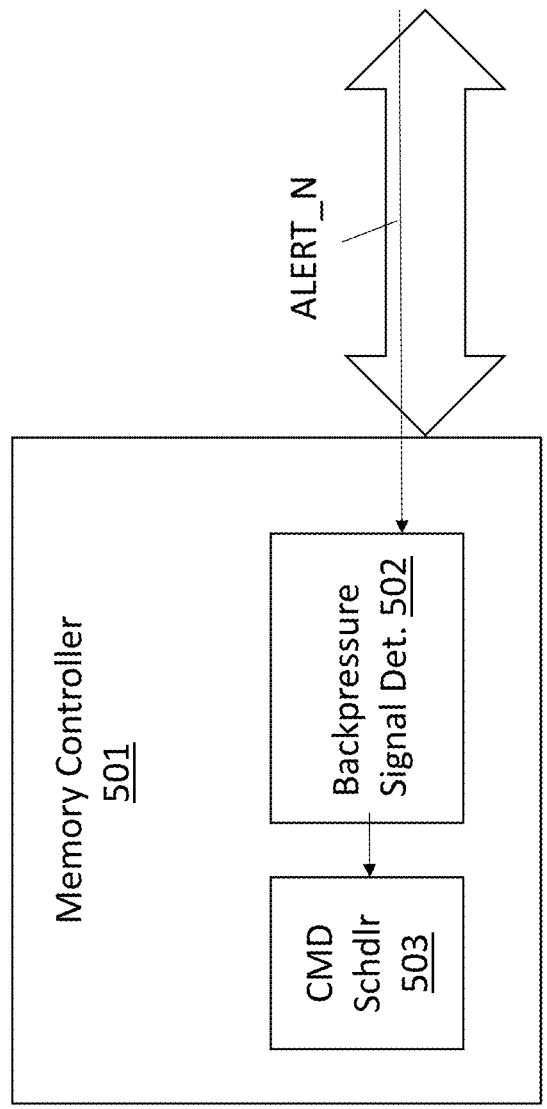
FIG. 5 shows an improved memory controller.

FIG. 5 shows a memory controller 501 that has been designed to handle a row hammer backpressure signal (or other kind of backpressure signal) consistent with the teachings provided above. In particular, the memory controller 501 includes an input to receive a signal from an ALERT_N wire that communicates errors/problems from a memory module and/or memory chip according to different pulse widths that are generated on the ALERT_N wire. One of the signals is backpressure signal such as a row hammer backpressure signal. As such, the memory controller 501 includes circuitry 502 that can differentiate amongst the different signals and detect a backpressure signal.

The memory controller 501 includes command scheduler circuitry 503 that determines which commands are sent to the memory modules/chips that the memory controller 501 is coupled to. The command scheduler logic circuitry 503 is designed to stop sending at least certain kinds of commands (e.g., read, write, activate) and/or send additional refresh commands (e.g., RFM commands) in response to the detection by the memory controller to a backpressure signal that is received at the ALERT_N input.

In still yet other embodiments, rather than using an ALERT_N wire, a backpressure signal is sent via digital communication through some kind of packetized communication link between the memory module and the memory controller. For example, certain wires of the command/address bus, or, the data bus (DQ bus) may be used to send packets back to the memory controller from a memory chip. Such packets may include a header and/or payload that corresponds to a backpressure signal as described above. The packetized communication link may be formed with a single wire or multiple wires depending on implementation. In the case of a multiple wire implementation, the terms "output" and "input" in relation to the sending and receiving of a backpressure signal can be construed to also include such multiple wires.

The teachings provided above can be applied to various memory implementations including JEDEC DDR5 implementations, JEDEC DDR6 implementations, JEDEC graphics DDR (GDDR) implementations, JEDEC High Bandwidth Memory (HBM) implementations, etc.

The various types of circuitry described above can be implemented, at least partially, with logic circuitry. Logic circuitry can include logic gates and/or larger logic macros formed with such logic gates that are dedicated and hardwired, programmable or configurable logic circuitry such as field programmable gate array (FPGA) circuitry and/or circuitry design to execute some form of program code (e.g., micro-controller).

Figure 6:
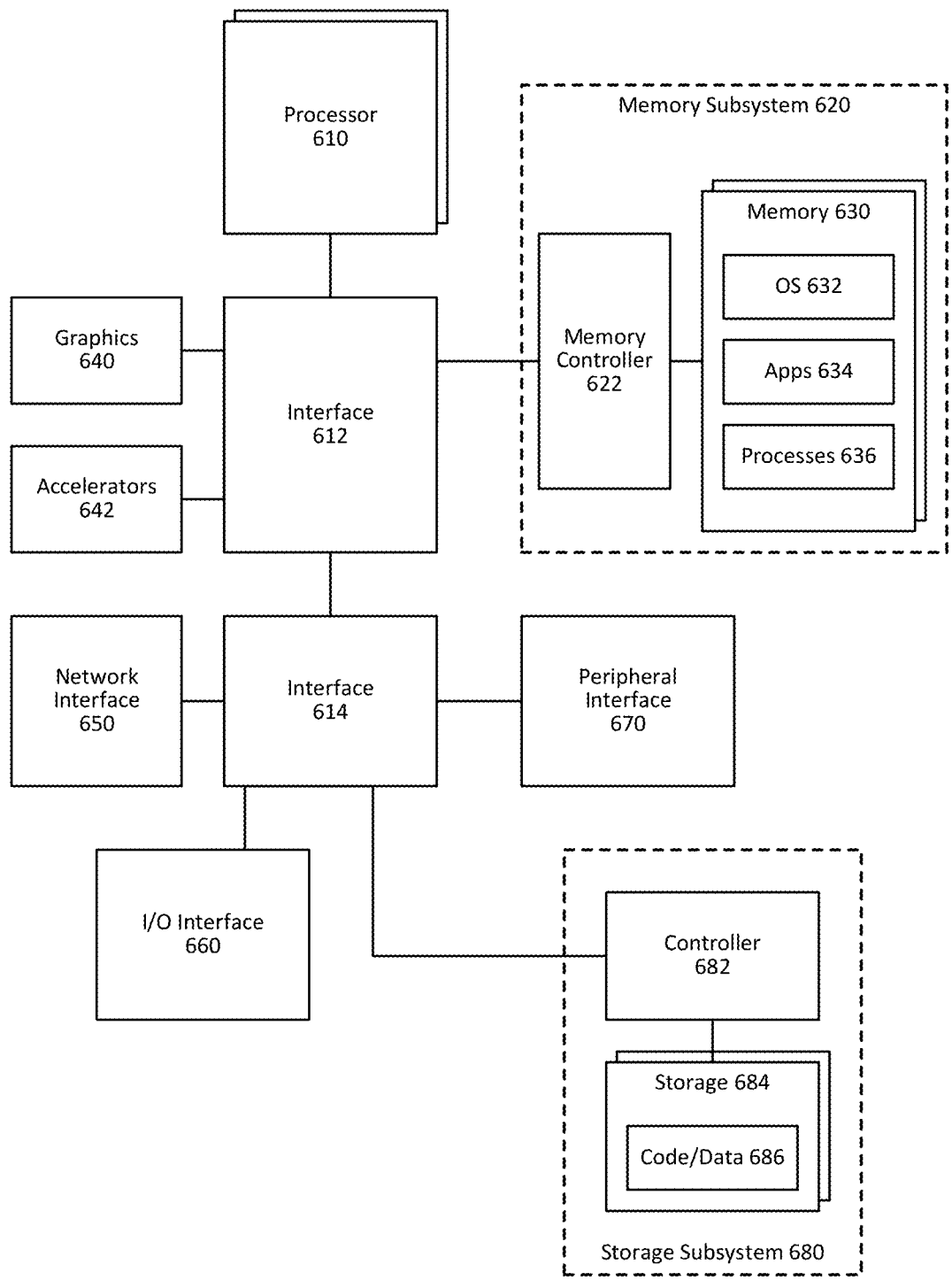
FIG. 6 shows a system.

FIG. 6 depicts an example system. The system can use the teachings provided herein. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 642 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, volatile memory, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007, DDR4 (DDR version 4, initial specification published in September 2012 by JEDEC), DDR4E (DDR version 4), LPDDR3 (Low Power DDR version3, JESD209-3B, August 2013 by JEDEC), LPDDR4 (LPDDR version 4, JESD209-4, originally published by JEDEC in August 2014), WIO2 (Wide Input/Output version 2, JESD229-2 originally published by JEDEC in August 2014), HBM (High Bandwidth Memory, JESD325, originally published by JEDEC in October 2013), LPDDR5 (currently in discussion by JEDEC), HBM2 (HBM version 2, currently in discussion by JEDEC), or others or combinations of memory technologies, and technologies based on derivatives or extensions of such specifications. The JEDEC standards are available at www.jedec.org.

The memory 630 could include one or more memory chips designed to send a backpressure signal, and, the memory controller 622 could respond to the backpressure signal according to the teachings described at length above with respect to FIGS. 3 through 5.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 600 includes interface 614, which can be coupled to interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data 686 in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits or logic in both processor 610 and interface 614.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 700 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 7:
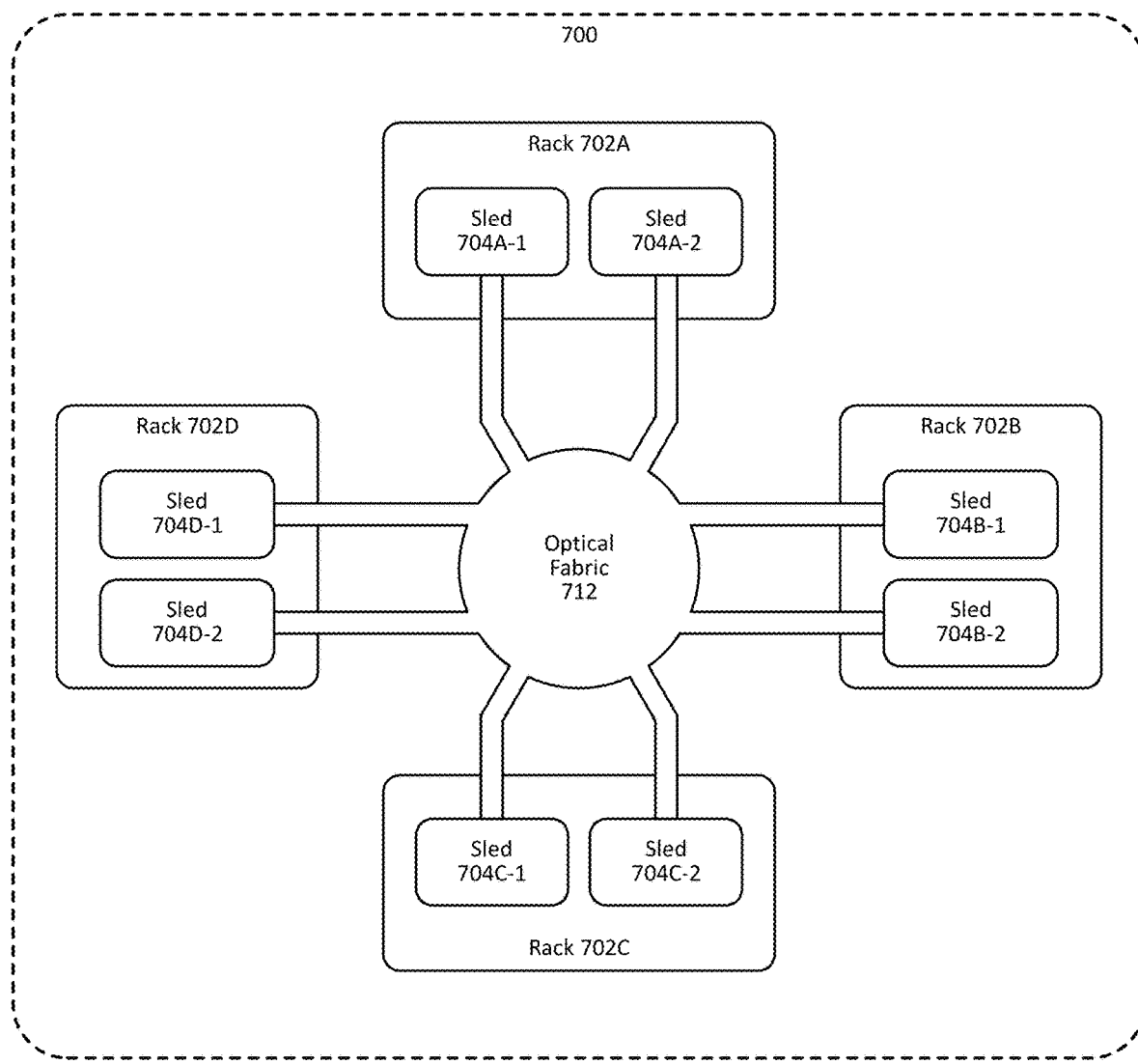
FIG. 7 shows a data center.

FIG. 7 depicts an example of a data center. Various embodiments can be used in or with the data center of FIG. 7. As shown in FIG. 7, data center 700 may include an optical fabric 712. Optical fabric 712 may generally include a combination of optical signaling media (such as optical cabling) and optical switching infrastructure via which any particular sled in data center 700 can send signals to (and receive signals from) the other sleds in data center 700. However, optical, wireless, and/or electrical signals can be transmitted using fabric 712. The signaling connectivity that optical fabric 712 provides to any given sled may include connectivity both to other sleds in a same rack and sleds in other racks. Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example. For example, fabric 712 can provide optical and/or electrical signaling.

Figure 8:
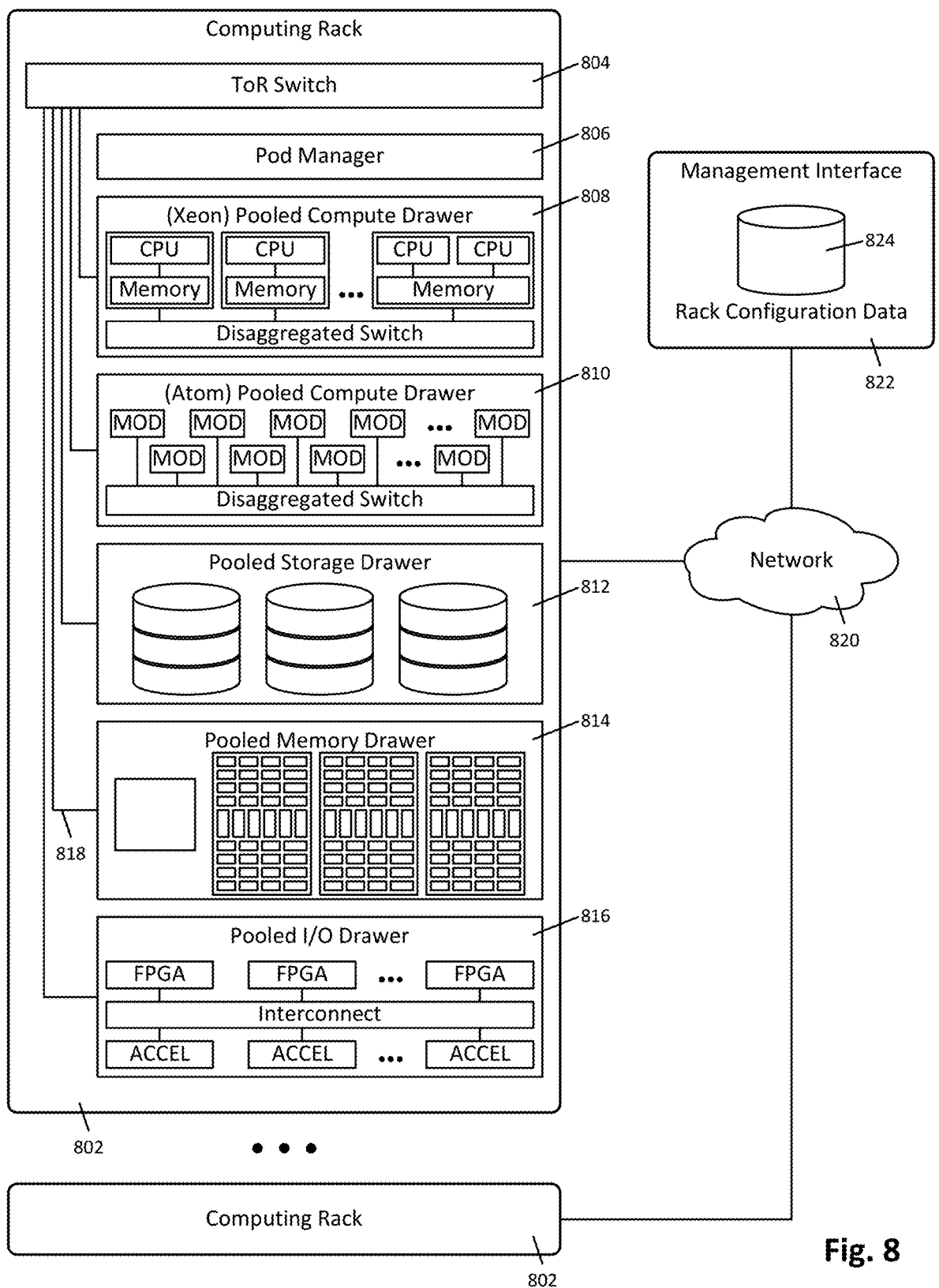
FIG. 8 shows an environment.

FIG. 8 depicts an environment 800 includes multiple computing racks 802, each including a Top of Rack (ToR) switch 804, a pod manager 806, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 808, and INTEL® ATOM™ pooled compute drawer 810, a pooled storage drawer 812, a pooled memory drawer 814, and an pooled 1/O drawer 816. Each of the pooled system drawers is connected to ToR switch 804 via a high-speed link 818, such as a 40 Gigabit/second (Gb/s) or 100 Gb/s Ethernet link or an 100+Gb/s Silicon Photonics (SiPh) optical link. In one embodiment high-speed link 818 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 800 may be interconnected via their ToR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations.

RSD environment 800 further includes a management interface 822 that is used to manage various aspects of the RSD environment. This includes managing rack configuration, with corresponding parameters stored as rack configuration data 824.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z".

The invention claimed is:

1. A memory chip, comprising:
    row hammer threat detection circuitry to detect a row hammer event where respective row activation counts for multiple rows of memory have concurrently reached a threshold, where the threshold indicates when the row activation count for a specific row becomes a row hammer threat;
    an output coupled to a signal line; and
    backpressure signal generation circuitry coupled between the row hammer threat detection circuitry and the output, the backpressure signal generation circuitry to send a backpressure signal on the signal line in response to detection of the row hammer event, the backpressure signal to indicate to a memory controller that the memory chip needs additional refresh time to internally mitigate the row hammer event.

2. The memory chip of claim 1 wherein the signal line is an alert_n signal line.

3. The memory chip of claim 1 wherein the backpressure signal is to share the signal line with another alert signal, and wherein the backpressure signal comprises a pulse having a minimum pulse width that is greater than a pulse width maximum of the other alert signal.

4. The memory chip of claim 3 wherein the minimum pulse width is dynamically configurable through configuration of a mode register (MR) space of the memory chip.

5. The memory chip of claim 3 wherein the other alert signal comprises a command/address (CA) parity error signal.

6. The memory chip of claim 1 wherein the memory chip comprises mode register (MR) space to provide information about the additional refresh time.

7. The memory chip of claim 6 wherein the information indicates a minimum time for the memory controller to cease sending read, write, and activation commands to the memory chip in response to receiving the backpressure signal.

8. The memory chip of claim 6 wherein the information is to affect how many refresh commands the memory controller is to send the memory chip in response to the backpressure signal.

9. The memory chip of claim 1 wherein in response to the backpressure signal, the memory chip is to receive refresh management (RFM) commands from the memory controller.

10. The memory chip of claim 1 wherein in response to the backpressure signal, the memory chip is to receive a self refresh command from the memory controller.

11. A memory controller, comprising:
an input coupled to a signal line to receive a backpressure signal to indicate that a memory chip has detected a row hammer event where respective row activation counts for multiple rows of memory have concurrently reached a threshold, where the threshold indicates when the row activation count for a specific row becomes a row hammer threat, and the memory chip needs additional refresh time to internally mitigate the row hammer event; and
command circuitry to stop sending read, write, and activation commands to the memory chip in response to receiving the backpressure signal.

12. The memory controller of claim 11 wherein the signal line is an alert_n signal line.

13. The memory controller of claim 11 wherein the backpressure signal is to share the signal line with another alert signal, and wherein the backpressure signal comprises a pulse having a minimum pulse width that is greater than a pulse width maximum of the other alert signal.

14. The memory controller of claim 11 wherein the memory controller is to read mode register (MR) space within the memory chip to obtain information about the additional refresh time.

15. The memory controller of claim 14 wherein the information is to indicate a minimum time for the memory controller to stop sending the read, write, and activation commands in response to receiving the backpressure signal.

16. The memory controller of claim 11 wherein the memory controller is to send refresh management (RFM) commands to the memory chip in response to the backpressure signal.

17. The memory controller of claim 11 wherein the memory controller is to send a self refresh command to the memory chip in response to the backpressure signal.

18. A computing system, comprising:
a) a plurality of processing cores;
b) a network interface;
c) a memory chip, the memory chip comprising:
i) row hammer threat detection circuitry to detect a row hammer event where respective row activation counts for multiple rows of memory have concurrently reached a threshold, where the threshold indicates when the row activation count for a specific row becomes a row hammer threat;
ii) an output coupled to a signal line; and
iii) backpressure signal generation circuitry coupled between the row hammer threat detection circuitry and the output, the backpressure signal generation circuitry to send a backpressure signal on the signal line in response to detection the row hammer event, the backpressure signal to indicate that the memory chip needs additional refresh time to internally mitigate the row hammer event; and
d) a memory controller coupled to the memory chip, the memory controller comprising:
i) an input coupled to the signal line; and
ii) command circuitry to stop sending read, write, and activation commands to the memory chip in response to receiving the backpressure signal.

19. The computing system of claim 18 wherein the signal line is an alert_n signal line.

20. The computing system of claim 18 wherein the memory controller is to send refresh management (RFM) commands or a self refresh command to the memory chip in response to the backpressure signal.

21. The computing system of claim 18 wherein the memory controller is to read mode register (MR) space within the memory chip to obtain information that indicates a minimum time for the memory controller to stop sending the read, write, and activation commands in response to receiving the backpressure signal.

* * * * *